(12) United States Patent
Yamazaki

(10) Patent No.: US 9,058,892 B2
(45) Date of Patent: Jun. 16, 2015

(54) SEMICONDUCTOR DEVICE AND SHIFT REGISTER

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 53 days.

(21) Appl. No.: 13/785,237

(22) Filed: Mar. 5, 2013

(65) Prior Publication Data

US 2013/0243149 A1    Sep. 19, 2013

(30) Foreign Application Priority Data

Mar. 14, 2012  (JP) ................................ 2012-057282
Jun. 1, 2012   (JP) ................................ 2012-125685

(51) Int. Cl.
| | |
|---|---|
| G11C 19/00 | (2006.01) |
| G11C 19/28 | (2006.01) |
| H01L 27/06 | (2006.01) |
| G11C 19/18 | (2006.01) |

(52) U.S. Cl.
CPC .............. G11C 19/28 (2013.01); H01L 27/06 (2013.01); *G09G 2310/0286* (2013.01); G11C 19/184 (2013.01)

(58) Field of Classification Search
None
See application file for complete search history.

(56) References Cited

U.S. PATENT DOCUMENTS

| | | |
|---|---|---|
| 4,656,607 A | 4/1987 | Hagiwara et al. |
| 4,797,576 A | 1/1989 | Asazawa |
| 4,809,225 A | 2/1989 | Dimmler et al. |
| 5,539,279 A | 7/1996 | Takeuchi et al. |
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 0 135 036 A2 | 3/1985 |
| EP | 0 297 777 A2 | 1/1989 |

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Tuan T Lam
(74) *Attorney, Agent, or Firm* — Fish & Richardson P.C.

(57) ABSTRACT

Data can be stored even when the supply of a power source voltage is stopped. A semiconductor device includes a logic circuit to which a data signal is input through an input terminal; a capacitor having a pair of electrodes, one of which is supplied with a high power source potential or a low power source potential and the other of which is supplied with a potential of the input terminal of the logic circuit, so that data of the data signal is written as stored data to the capacitor; and a transistor for controlling conduction between the input terminal of the logic circuit and the other of the pair of electrodes of the capacitor, thereby controlling rewriting, storing, and reading of the stored data. The off-state current per micrometer of channel width of the transistor is lower than or equal to 100 zA.

18 Claims, 10 Drawing Sheets

(56) References Cited

U.S. PATENT DOCUMENTS

| | | | |
|---|---|---|---|
| 5,936,879 A | 8/1999 | Brouwer et al. | |
| 6,127,702 A | 10/2000 | Yamazaki et al. | |
| 6,294,274 B1 | 9/2001 | Kawazoe et al. | |
| 6,483,363 B1* | 11/2002 | Karnik et al. | 327/211 |
| 6,563,174 B2 | 5/2003 | Kawasaki et al. | |
| 6,576,943 B1 | 6/2003 | Ishii et al. | |
| 6,727,522 B1 | 4/2004 | Kawasaki et al. | |
| 6,738,281 B2 | 5/2004 | Yokozeki | |
| 6,788,567 B2 | 9/2004 | Fujimori | |
| 6,809,952 B2 | 10/2004 | Masui | |
| 6,845,032 B2 | 1/2005 | Toyoda et al. | |
| 6,876,023 B2 | 4/2005 | Ishii et al. | |
| 6,944,045 B2 | 9/2005 | Fujimori | |
| 6,972,986 B2 | 12/2005 | Peng et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,064,973 B2 | 6/2006 | Peng et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,516,171 B2 | 4/2009 | Uehara | |
| 7,616,040 B2 | 11/2009 | Motomura | |
| 7,674,650 B2 | 3/2010 | Akimoto et al. | |
| 7,732,819 B2 | 6/2010 | Akimoto et al. | |
| 7,847,287 B2 | 12/2010 | Kim et al. | |
| 7,863,611 B2 | 1/2011 | Abe et al. | |
| 7,940,085 B2 | 5/2011 | Kim et al. | |
| 8,046,615 B2 | 10/2011 | Taguchi et al. | |
| 8,085,076 B2 | 12/2011 | Djaja et al. | |
| 8,158,987 B2 | 4/2012 | Nabekura et al. | |
| 8,217,680 B2 | 7/2012 | Kim et al. | |
| 8,410,838 B2* | 4/2013 | Kato et al. | 327/215 |
| 8,575,985 B2* | 11/2013 | Ohmaru et al. | 327/208 |
| 8,599,998 B2* | 12/2013 | Umezaki et al. | 377/64 |
| 8,605,073 B2* | 12/2013 | Umezaki et al. | 345/211 |
| 2001/0046027 A1 | 11/2001 | Tai et al. | |
| 2002/0056838 A1 | 5/2002 | Ogawa | |
| 2002/0074568 A1 | 6/2002 | Yoshida et al. | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0071039 A1 | 4/2004 | Fujimori | |
| 2004/0127038 A1 | 7/2004 | Carcia et al. | |
| 2004/0164778 A1 | 8/2004 | Toyoda et al. | |
| 2004/0214389 A1 | 10/2004 | Madurawe | |
| 2005/0017302 A1 | 1/2005 | Hoffman | |
| 2005/0169039 A1 | 8/2005 | Peng et al. | |
| 2005/0169040 A1 | 8/2005 | Peng et al. | |
| 2005/0199959 A1 | 9/2005 | Chiang et al. | |
| 2005/0205921 A1 | 9/2005 | Ishii et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0095975 A1 | 5/2006 | Yamada et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0119406 A1* | 6/2006 | Henzler et al. | 327/208 |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0002605 A1 | 1/2007 | Koide | |
| 2007/0019460 A1 | 1/2007 | Kang et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0126666 A1 | 6/2007 | Yamazaki et al. | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0048744 A1 | 2/2008 | Fukuoka | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0170028 A1 | 7/2008 | Yoshida | |
| 2008/0182358 A1 | 7/2008 | Cowdery-Corvan et al. | |
| 2008/0197414 A1 | 8/2008 | Hoffman et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0258789 A1 | 10/2008 | Motomura | |
| 2008/0296568 A1 | 12/2008 | Ryu et al. | |
| 2009/0002044 A1 | 1/2009 | Kobayashi | |
| 2009/0002590 A1 | 1/2009 | Kimura | |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0019839 A1 | 1/2010 | Monden | |
| 2010/0065844 A1 | 3/2010 | Tokunaga | |
| 2010/0085081 A1 | 4/2010 | Ofuji et al. | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2010/0193785 A1 | 8/2010 | Kimura | |
| 2010/0246750 A1* | 9/2010 | Kimura et al. | 377/64 |
| 2011/0010493 A1 | 1/2011 | Kimura et al. | |
| 2011/0024741 A1 | 2/2011 | Abe et al. | |
| 2011/0089417 A1 | 4/2011 | Yamazaki et al. | |
| 2011/0101351 A1 | 5/2011 | Yamazaki | |
| 2011/0121878 A1 | 5/2011 | Kato et al. | |
| 2011/0148463 A1 | 6/2011 | Kato et al. | |
| 2011/0156024 A1* | 6/2011 | Koyama et al. | 257/43 |
| 2011/0176357 A1* | 7/2011 | Koyama et al. | 365/149 |
| 2011/0187410 A1* | 8/2011 | Kato et al. | 326/46 |
| 2012/0032730 A1 | 2/2012 | Koyama | |

(56) References Cited

U.S. PATENT DOCUMENTS

| | | | |
|---|---|---|---|
| 2013/0222033 A1* | 8/2013 | Kato et al. | 327/214 |
| 2013/0229218 A1* | 9/2013 | Nishijima | 327/207 |
| 2014/0111262 A1* | 4/2014 | Ishii | 327/210 |

FOREIGN PATENT DOCUMENTS

| | | |
|---|---|---|
| EP | 0 530 928 A2 | 3/1993 |
| EP | 0 818 891 A2 | 1/1998 |
| EP | 1 447 909 A1 | 8/2004 |
| EP | 1 583 239 A2 | 10/2005 |
| EP | 1 737 044 A1 | 12/2006 |
| EP | 2 226 847 A2 | 9/2010 |
| JP | 60-025269 A | 2/1985 |
| JP | 60-198861 A | 10/1985 |
| JP | 62-177794 A | 8/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 64-066899 A | 3/1989 |
| JP | 03-192915 A | 8/1991 |
| JP | 05-110392 A | 4/1993 |
| JP | 05-251705 A | 9/1993 |
| JP | 07-147530 A | 6/1995 |
| JP | 08-264794 A | 10/1996 |
| JP | 10-093423 A | 4/1998 |
| JP | 11-505377 A | 5/1999 |
| JP | 2000-044236 A | 2/2000 |
| JP | 2000-077982 A | 3/2000 |
| JP | 2000-077982 A | 3/2000 |
| JP | 2000-150900 A | 5/2000 |
| JP | 2000-269457 A | 9/2000 |
| JP | 2002-076356 A | 3/2002 |
| JP | 2002-289859 A | 10/2002 |
| JP | 2003-086100 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-269616 A | 9/2005 |
| JP | 2005-323295 A | 11/2005 |
| JP | 2006-050208 A | 2/2006 |
| JP | 2006-165532 A | 6/2006 |
| JP | 2007-096055 A | 4/2007 |
| JP | 2007-123861 A | 5/2007 |
| JP | 2007-125823 A | 5/2007 |
| JP | 2007-179021 A | 7/2007 |
| JP | 2008-147903 A | 6/2008 |
| JP | 2009-116851 A | 5/2009 |
| JP | 2009-206942 A | 9/2009 |
| JP | 2009-212443 A | 9/2009 |
| JP | 2010-034710 A | 2/2010 |
| WO | 03/044953 A1 | 5/2003 |
| WO | 2004/059838 A1 | 7/2004 |
| WO | 2004/114391 A1 | 12/2004 |
| WO | 2009/110623 A1 | 9/2009 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG—Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

(56) References Cited

OTHER PUBLICATIONS

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel, YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

(56) References Cited

OTHER PUBLICATIONS

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for sub-1 V Supply DRAMs ," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Yamazaki, S et al., "Research, Development, and Application of Crystalline Oxide Semiconductor," SID Digest '12 : SID International Symposium Digest of Technical Papers, Jun. 3, 2012, pp. 183-186.

Nishijima, T et al., "Low-power Display System Driven by Utilizing Technique Using Crystalline IGZO Transistor," SID Digest '12 : SID International Symposium Digest of Technical Papers, 2012, pp. 583-586.

\* cited by examiner

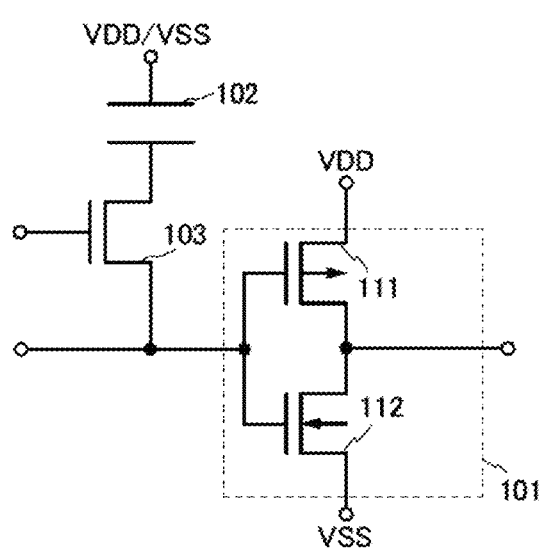
FIG. 1A
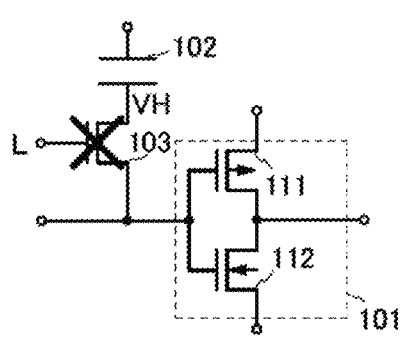
FIG. 1B1
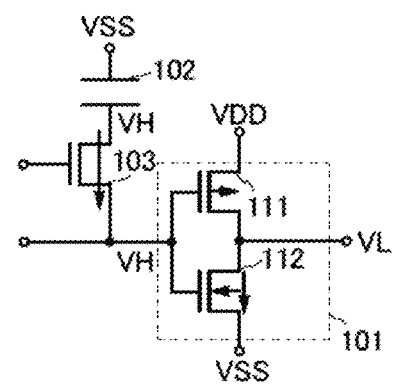
FIG. 1B2

SEMICONDUCTOR DEVICE AND SHIFT REGISTER

BACKGROUND OF THE INVENTION

1. Field of the Invention

The present invention relates to a semiconductor device. The present invention also relates to a shift register.

2. Description of the Related Art

Techniques for reducing the power consumption of semiconductor devices using logic circuits, such as processors, have been developed in recent years.

The reduction in power consumption is realized by, for example, a driving method (also referred to as power gating) for stopping the supply of power source voltages to logic circuits, memories, and the like in a central processing unit (CPU) in a period during which the supply of power is not necessary (see Patent Document 1, for example).

REFERENCE

Patent Document

[Patent Document 1] Japanese Published Patent Application No. 2009-116851

SUMMARY OF THE INVENTION

Conventional semiconductor devices have a problem of high power consumption. For example, in the semiconductor device disclosed in Patent Document 1, after the supply of a power source voltage is restarted, it is necessary that data be read again from another memory or the like or a signal pulse be input again for data writing in order that the state of the semiconductor device is restored to the same state as it was before the supply of a power source voltage is stopped. This consumes power and it takes time for the state to be restored.

As one of the methods for solving the above problem, a non-volatile memory element for storing data has been suggested to be provided in a logic circuit of a semiconductor device. As the non-volatile memory element, for example, a magnetoresistive random access memory (also referred to as an MRAM) has been proposed.

However, the MRAM has a problem of high power consumption in writing though it operates at high speed, which poses a dilemma: power consumption would probably increase if the supply of a power source voltage is stopped only for a short time of period.

An object of one embodiment of the present invention is to store data even when the supply of a power source voltage is stopped. Another object of one embodiment of the present invention is to reduce power consumption.

In one embodiment of the present invention, data of a data signal input to a logic circuit is retained as stored data in a capacitor with use of a transistor. At this time, the transistor controls conduction between an input terminal of the logic circuit and one of a pair of electrodes of the capacitor, thereby controlling rewriting, holding, and reading of the stored data.

Furthermore, a transistor with low off-state current is used as the transistor, so that data which has been written to the capacitor can be stored, for example, even when the supply of a power source voltage to a semiconductor device is stopped.

One embodiment of the present invention is a semiconductor device including a logic circuit to which a data signal is input through an input terminal; a capacitor having a pair of electrodes, one of which is supplied with a high power source potential or a low power source potential and the other of which is supplied with a potential of the input terminal of the logic circuit, so that data of the data signal is written as stored data to the capacitor; and a transistor for controlling conduction between the input terminal of the logic circuit and the other of the pair of electrodes of the capacitor, thereby controlling rewriting, storing, and reading of the stored data. The off-state current per micrometer of channel width of the transistor is lower than or equal to 100 zA.

Another embodiment of the present invention is a shift register including a flip-flop having a logic circuit to which a data signal is input through an input terminal; a capacitor having a pair of electrodes, one of which is supplied with a high power source potential or a low power source potential and the other of which is supplied with a potential of the input terminal of the logic circuit, so that data of the data signal is written as stored data to the capacitor; and a transistor for controlling conduction between the input terminal of the logic circuit and the other of the pair of electrodes of the capacitor, thereby controlling rewriting, storing, and reading of the stored data. The off-state current per micrometer of channel width of the transistor is lower than or equal to 100 zA. A plurality of the flip-flops are provided, and a plurality of the capacitors and a plurality of the transistors are provided corresponding to at least two or more of the plurality of the flip-flops.

According to one embodiment of the present invention, data can be stored in a capacitor even when the supply of a power source voltage is stopped. Further, rewriting, storing, and reading of the data stored in the capacitor can be controlled by turning a transistor on or off, resulting in a reduction in power consumption.

BRIEF DESCRIPTION OF THE DRAWINGS

In the accompanying drawings:

FIGS. 1A, 1B1, and 1B2 are circuit diagrams illustrating an example of a semiconductor device;

FIG. 2 is an Arrhenius plot showing the off-state current of a transistor;

DETAILED DESCRIPTION OF THE INVENTION

Figure 2:
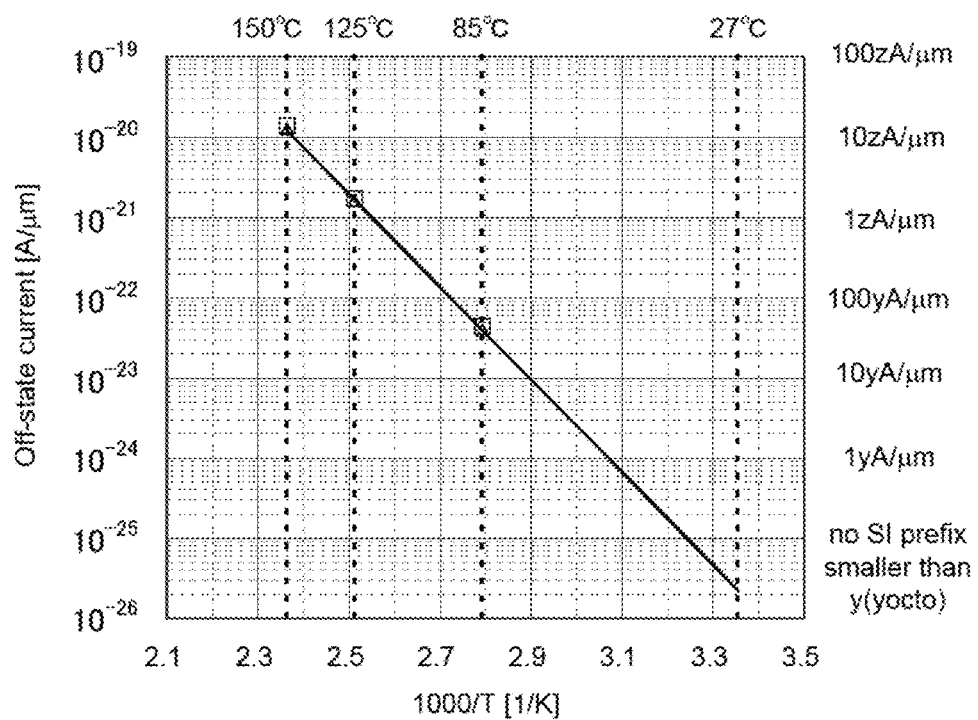

Examples of embodiments of the present invention will be described. Note that it will be readily appreciated by those skilled in the art that details of the embodiments can be modified without departing from the spirit and scope of the present invention. Thus, the present invention should not be limited to, for example, the description of the following embodiments.

Note that the contents in different embodiments can be combined with one another as appropriate. In addition, the contents of the embodiments can be replaced with each other as appropriate.

Further, the ordinal numbers such as "first" and "second" are used to avoid confusion between components and do not limit the number of each component.

Embodiment 1

Described in this embodiment is an example of a semiconductor device including a logic circuit, the semiconductor device being one embodiment of the present invention.

FIGS. 1A, 1B1, and 1B2 are circuit diagrams illustrating an example of the semiconductor device of this embodiment.

The semiconductor device illustrated in FIG. 1A includes a logic circuit 101, a capacitor 102, and a transistor 103.

A data signal is input to the logic circuit 101 through an input terminal. A potential which changes depending on the input data signal is output as a signal from the logic circuit 101.

In FIG. 1A, the logic circuit 101 is a NOT circuit including a p-channel transistor 111 and an n-channel transistor 112. The transistors 111 and 112 can be, for example, transistors using a semiconductor including silicon.

In that case, gates of the transistors 111 and 112 serve as an input terminal of the logic circuit 101.

A high power source potential VDD is applied to one of a source and a drain of the transistor 111, and a low power source potential VSS is applied to one of a source and a drain of the transistor 112. Note that the configuration of the logic circuit 101 is not limited to the above, and for example, an OR circuit, an AND circuit, or a NOR circuit can be employed. Further, a register, a flip-flop, or the like, can be configured using the logic circuit 101.

The high power source potential VDD or the low power source potential VSS is applied to one of a pair of electrodes of the capacitor 102, and a potential of the input terminal of the logic circuit 101 is applied to the other of the pair of electrodes of the capacitor 102. Note that the high power source potential VDD is relatively higher than the low power source potential VSS, and the low power source potential VSS is relatively lower than the high power source potential VDD. A potential difference between the high power source potential VDD and the low power source potential VSS is a power source voltage.

When the aforementioned potentials are applied to the respective pair of electrodes of the capacitor 102, data of the data signal is written as stored data to the capacitor 102.

A control signal is input to a gate of the transistor 103. The on- or off-state of the transistor 103 is controlled by the control signal. The transistor 103 controls conduction between the input terminal of the logic circuit 101 and the other of the pair of electrodes of the capacitor 102, thereby controlling rewriting, storing, and reading of the stored data in the capacitor 102.

A transistor with low off-state current can be used as the transistor 103, for example.

In that case, it is preferable that the off-state current per micrometer of channel width of the transistor with low off-state current be lower than or equal to $1\times10^{-19}$ A (100 zA) at room temperature (25° C.).

As the aforementioned transistor with low off-state current, a transistor including a channel formation region using an oxide semiconductor can be employed. A metal oxide-based material can be used for the oxide semiconductor, and examples of the oxide semiconductor are a metal oxide containing zinc and at least one of indium and gallium, and the metal oxide in which gallium is partly or entirely replaced with another metal element.

The carrier density of the oxide semiconductor included in the channel is lower than $1\times10^{14}$ atoms/cm$^3$, preferably lower than $1\times10^{12}$ atoms/cm$^3$, and more preferably lower than $1\times10^{11}$ atoms/cm$^3$. In order to realize such a carrier density, the concentration of donor impurities contained in the oxide semiconductor needs to be reduced: for example, the amount of hydrogen regarded as a donor impurity is preferably reduced to $1\times10^{19}$ atoms/cm$^3$ or lower, more preferably $1\times10^{18}$ atoms/cm$^3$ or lower.

With the above carrier density, the off-state current per micrometer of channel width of a field-effect transistor can be reduced to $1\times10^{-19}$ A (100 zA) or lower, preferably $1\times10^{-20}$ A (10 zA) or lower, more preferably $1\times10^{-21}$ A (1 zA) or lower, and even more preferably $1\times10^{-22}$ A (100 yA) or lower.

The off-state current of a transistor will be described with reference to FIG. 2, the transistor including a channel formation region using an oxide semiconductor containing indium, zinc, and gallium.

Since the off-state current of the transistor is extremely low, in order to measure the off-state current, it is necessary to fabricate a transistor with a relatively large size and estimate an actually flowing off-state current.

As an example, FIG. 2 shows an Arrhenius plot of the off-state current estimated from the off-state current per micrometer of channel width W of a transistor having a channel width W of 1 m (1000000 μm) and a channel length L of 3 μm when the temperature changes to 150° C., 125° C., 85° C., and 27° C.

In FIG. 2, for example, the off-state current of the transistor at 27° C. is lower than or equal to $1\times10^{-25}$ A. FIG. 2 shows that the transistor including a channel formation region using an oxide semiconductor containing indium, zinc, and gallium has an extremely low off-state current.

By using the above transistor with low off-state current as the transistor 103, data can be stored in the capacitor 102 even when the supply of a power source voltage is stopped.

Note that the transistor 103 may be stacked, for example, over a transistor (e.g., the transistors 111 and 112) included in the logic circuit 101, so that the circuit area can be reduced.

Next, description is made on an example of a method for driving the semiconductor device illustrated in FIG. 1A. Note that described here is an example where VSS is applied to the one of the pair of electrodes of the capacitor 102 and a high-level data signal is input.

When a data signal is input to the logic circuit 101 through the input terminal, the transistor 111 or 112 is turned on in accordance with the potential of the input terminal.

For example, when a high-level data signal is input so that the input terminal has a high-level potential (also referred to as VH), the transistor 112 is turned on and the transistor 111 is turned off. On the other hand, when a low-level data signal is input so that the input terminal has a low-level potential (also referred to as VL), the transistor 111 is turned on and the transistor 112 is turned off.

Further, description is made on the case of storing data of the data signal input through the input terminal.

First, the transistor 103 is turned on.

At this time, the other of the pair of electrodes of the capacitor 102 has a potential equal to that of the data signal. After that, the transistor 103 is turned off as illustrated in FIG. 1B1, whereby the data of the data signal (here, VH) is written to the capacitor 102.

Since the transistor 103 has low off-state current, the written data of the data signal is stored in a period during which the transistor 103 is off. Hence, even in the case where, for example, the supply of a power source voltage to the semiconductor device is stopped, the data of the data signal can be stored.

After that, in the case where the state of the semiconductor device is restored, the supply of a power source voltage to the semiconductor device is restarted so that the transistor 103 is turned on as illustrated in FIG. 1B2.

At this time, the input terminal of the logic circuit 101 has a potential equal to that of the other of the pair of electrodes of the capacitor 102. Accordingly, the data of the data signal (here, VH) which has been written to the capacitor 102 is read to be input to the logic circuit 101. As a result, the state of the semiconductor device can be restored.

In the semiconductor device of this embodiment, the transistor 103 may be turned on when data of a data signal is written to and read from the capacitor 102. The less frequently the transistor 103 is turned on, the less the power consumption becomes.

Further, the capacitor 102 preferably has a capacitance more than or equal to 1 time and less than 20 times as large as the capacitance of a parasitic capacitor connected to the input terminal of the logic circuit 101, whereby the aforementioned operation can be properly performed. Note that the capacitance of the capacitor 102 may be more than or equal to 12 and less than 50 times as large as that of the parasitic capacitor connected to the input terminal of the logic circuit 101.

Here, description is made on an example of calculation of the capacitance of the capacitor 102 which is necessary for the aforementioned operation.

Figure 3:
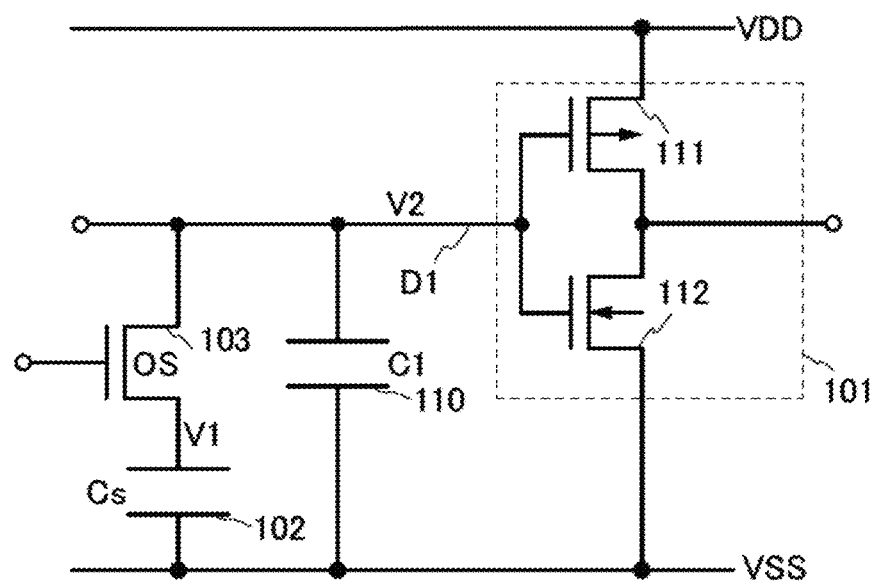
FIG. 3 is a circuit diagram illustrating an example of a semiconductor device.

As an example, the case of the configuration illustrated in FIG. 3 is considered.

The configuration illustrated in FIG. 3 is equivalent to the configuration illustrated in FIGS. 1A, 1B1, and 1B2 in which a ground potential is applied as the low power source potential VSS to one of the pair of electrodes of the capacitor 102 and a parasitic capacitor 110 is connected to the input terminal.

Here, in the case where data of a data signal which has been written to the capacitor 102 is read, V1 denotes a voltage applied to the parasitic capacitor 110 in a period during which the transistor 103 is off before or after the supply of a power source voltage is restarted. Further, V2 denotes a voltage applied to the capacitor 102 in a period during which the transistor 103 is on after the supply of a power source voltage is restarted. Moreover, Cs denotes the capacitance of the capacitor 102 and C1 denotes the capacitance of the parasitic capacitor 110; then, V2 is represented by the following formula (1).

$$V2 = \frac{V1 \times Cs}{Cs + C1} \quad (1)$$

Furthermore, in the case where V1 is equal to the high power source potential VDD and V2 is equal to the high-level potential, the following formula (2) needs to be satisfied in order to determine whether the data signal is at high level or low level in the logic circuit 101.

$$V2 > 0.7 \times VDD \quad (2)$$

In that case, 0.7 is a value based on the specification of the semiconductor device.

Further, the following formula (3) is obtained from the formula (1) and the formula (2).

$$\frac{Cs}{Cs + C1} > 0.7 \quad (3)$$

Still further, the following formula (4) is obtained by modifying the formula (3).

$$Cs > 2.333 \times C1 \quad (4)$$

Except for the case of extending outside the cell, C1 of about 0.3 fF is considered sufficient. Accordingly, in the case where C1 in the formula (4) is 0.3 fF, data of a data signal can be determined without any problem if Cs is more than or equal to about 0.7 fF.

That is the description of an example of calculation of the capacitance of the capacitor 102 which is necessary for the operation of the semiconductor device.

Note that the configuration of the semiconductor device of this embodiment is not limited to that illustrated in FIGS. 1A, 1B1, and 1B2.

Figure 4A:
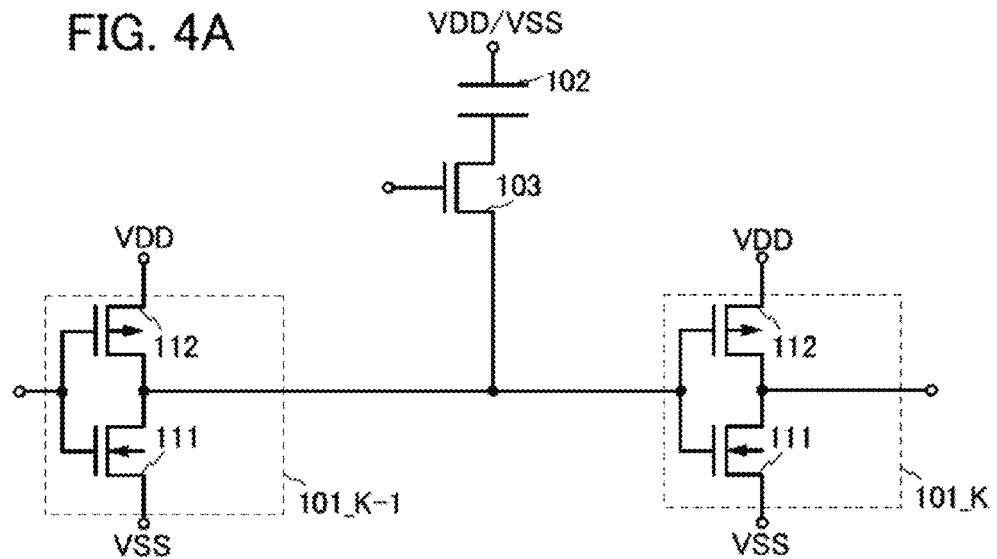
FIGS. 4A and 4B are circuit diagrams illustrating examples of a semiconductor device.

For example, a semiconductor device illustrated in FIG. 4A includes a logic circuit 101_K (K is a natural number of 2 or more) and a logic circuit 101_K−1 instead of the logic circuit 101 illustrated in FIGS. 1A, 1B1, and 1B2.

An input terminal of the logic circuit 101_K is electrically connected to an output terminal of the logic circuit 101_K−1.

The transistor 103 has a function of controlling conduction between the input terminal of the logic circuit 101_K and the other of the pair of electrodes of the capacitor 102.

Figure 4B:
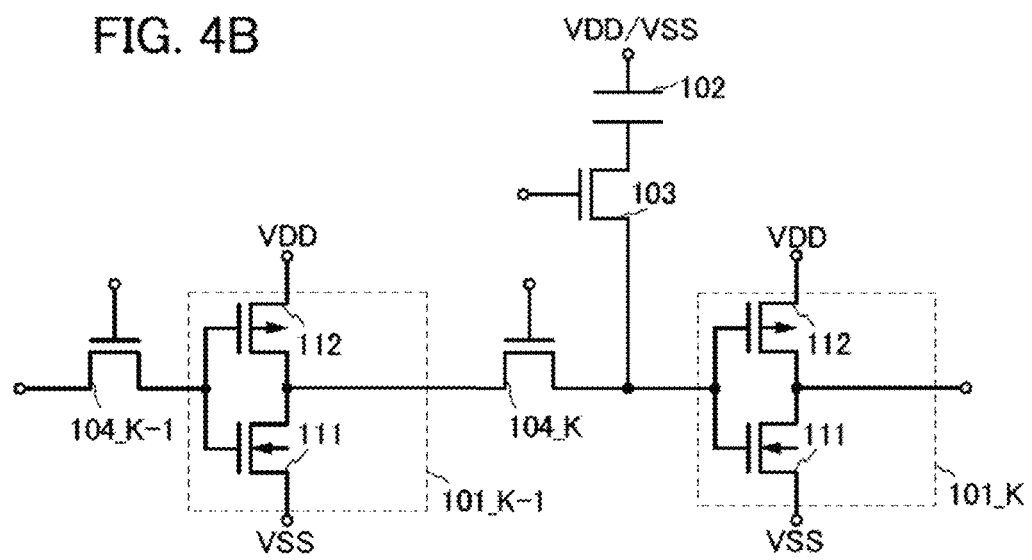

Further, a semiconductor device illustrated in FIG. 4B includes a transistor 104 (a transistor 104_K and a transistor 104_K−1). The semiconductor device illustrated in FIG. 4B includes, but is not limited to, the logic circuit 101_K and the logic circuit 101_K−1 as in the semiconductor device illustrated in FIG. 4A.

The transistor 104_K has a function of controlling conduction between the output terminal of the logic circuit 101_K−1 and the input terminal of the logic circuit 101_K.

The transistor 104_K−1 has a function of controlling conduction between an output terminal of another logic circuit 101 (not illustrated) and an input terminal of the logic circuit 101_K−1.

The transistor 104 may be, for example, a transistor using a semiconductor containing silicon, or a transistor capable of being used as the transistor 103.

The transistor 104 allows controlling of the timing at which an output signal of the logic circuit 101 in a preceding stage is input to the logic circuit 101 in the following stage.

Figure 10:
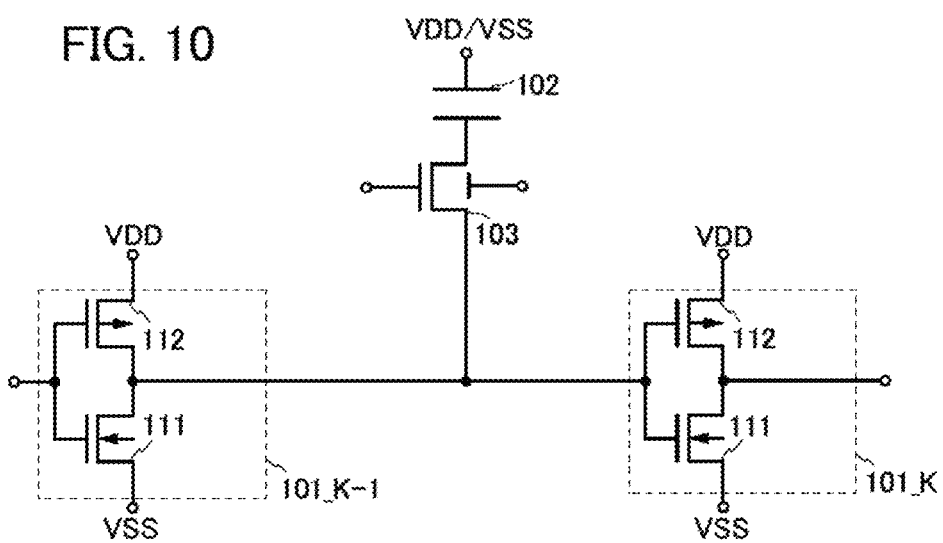
FIG. 10 is a circuit diagram illustrating an example of a semiconductor device.

Note that as illustrated in FIG. 10, the potential of a back-gate of the transistor 103 may be controlled in the structure of FIG. 4A. In the case where, for example, the transistor 103 is an n-channel transistor, the threshold voltage of the transistor 103 can be shifted to a positive side when the potential of the back-gate is set to a negative value.

That is the description of the semiconductor device of this embodiment.

As described with reference to FIGS. 1A, 1B1, and 1B2, FIG. 2, FIG. 3, and FIGS. 4A and 4B, in an example of the semiconductor device of this embodiment, data of a data signal input to a logic circuit is retained as stored data in a capacitor with use of a transistor. At this time, the transistor controls conduction between an input terminal of the logic circuit and one of a pair of electrodes of the capacitor, thereby controlling rewriting, storing, and reading of the stored data. In other words, the capacitor is provided in parallel with the input terminal of the logic circuit.

With the above structure, data which has been written to the capacitor can be stored, for example, even when the supply of a power source voltage to the semiconductor device is stopped. Further, after the supply of a power source voltage to the semiconductor device is restarted, the data which has been written to the capacitor is read to be input to the logic circuit; thus, the state of the semiconductor device can be quickly restored before the supply of a power source voltage is stopped, which facilitates stopping and restarting of supply of a power source voltage.

Various processors such as a CPU can be configured using the aforementioned semiconductor device. The use of the above semiconductor device results in a reduction in power consumption.

Further, Table 1 shows comparison between a magnetic tunnel junction (MTJ) element used in an MRAM and a storage portion using the transistor 103 and the capacitor 102 of this embodiment.

TABLE 1

|  | Spintronics (MTJ Element) | Capacitor 102 + Transistor 103 |
| --- | --- | --- |
| Heat Resistance | Curie Temperature | Process Temperature: 500° C. (Reliability at 150° C.) |
| Driving Method | Current Driving | Voltage Driving |
| Writing Principle | Changing Magnetization Direction of Magnetic Body | On/Off of Transistor 102 |
| Si LSI | Suitable for Bipolar LSI (MOS device is preferable for high integration because bipolar device is unsuitable for high integration. Note that W gets larger.) | Suitable for MOS LSI |
| Overhead | Large (due to high Joule heat) | Smaller by 2 to 3 or more orders of magnitude than the MTJ element (due to charging and discharging of parasitic capacitance) |
| Nonvolatility | Utilizing Spin | Utilizing Low Off-State Current |
| Number of Times of Reading | without Limitation | without Limitation |
| 3D conversion | Difficult (at most two layers) | Easy (the number of layers is limitless) |
| Material | Magnetic Rare-Earth Element | Oxide Semiconductor |
| Resistance to Magnetic Field | Low | High |
| Determination Circuit | Necessary | Unnecessary |

The MTJ element contains a magnetic material and therefore is disadvantageous in that its magnetic properties are lost when the temperature is higher than or equal to the Curie temperature. Further, the MTJ element is driven by current and thus is compatible with a silicon bipolar device; however, the bipolar device is unsuitable for high integration.

In addition, the MTJ element has low resistance to a magnetic field, so that the magnetization direction is likely to change when the MTJ element is exposed to a high magnetic field. Moreover, magnetic fluctuation is caused by nanoscaling of a magnetic body used for the MTJ element.

The MTJ element is driven by current and thus needs high writing current; on the other hand, in the case where the capacitor 102 and the transistor 103 are used, since they are driven by voltage, writing current can be reduced.

Furthermore, in the MTJ element, a determination circuit is necessary for determining the value of retained data when the data is read to be input to the logic circuit 101. Thus, when the MTJ element is used to, for example, realize a function similar to that of the semiconductor device illustrated in FIGS. 1A, 1B1, and 1B2, a determination circuit needs to be connected to the input terminal of the logic circuit 101, which leads to a complication of circuit configuration and an increase in circuit area. On the other hand, a determination circuit is not necessary in this embodiment, and data can be stored and read with use of the capacitor 102 and the transistor 103.

The transistor using an oxide semiconductor which is described in this embodiment has an element structure and an operation principle similar to those of a silicon MOSFET except that a channel is formed using a metal oxide semiconductor material. Further, the transistor using an oxide semiconductor is neither affected by a magnetic field nor likely to cause soft errors. These facts show that the transistor is highly compatible with a silicon integrated circuit.

Embodiment 2

In this embodiment, an example of a shift register will be described as an example of the semiconductor device shown in Embodiment 1.

Figure 5A:
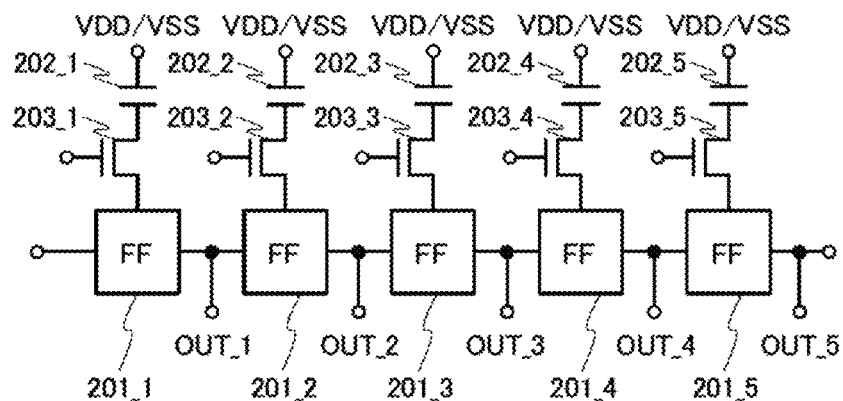
FIGS. 5A to 5C are diagrams illustrating examples of a shift register.
Figure 5B:
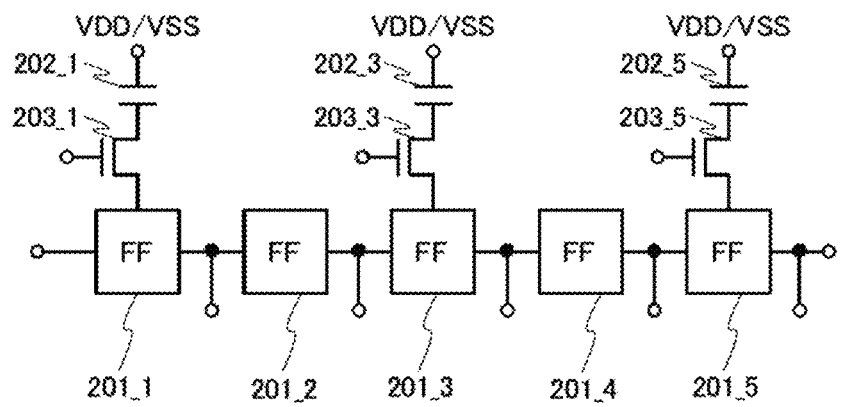
Figure 5C:
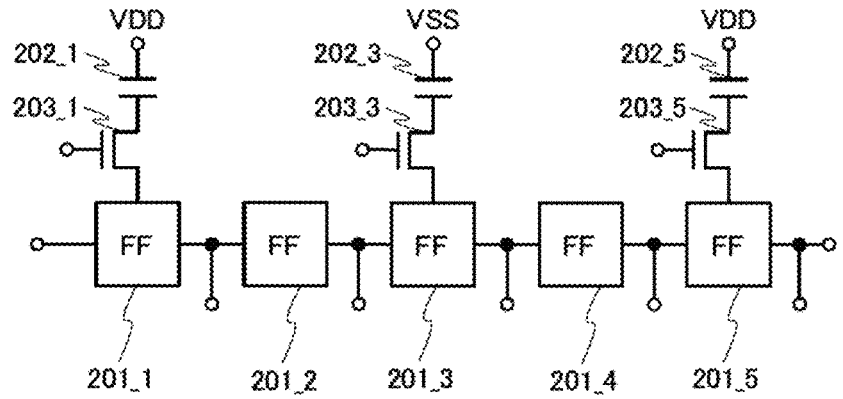

FIGS. 5A to 5C are diagrams illustrating examples of the shift register of this embodiment.

The shift register illustrated in FIG. 5A includes a plurality of flip-flops (also referred to as FFs) 201 (201_1 to 201_5), a plurality of capacitors 202 (202_1 to 202_5), and a plurality of transistors 203 (203_1 to 203_5). Note that the numbers of the flip-flops 201, the capacitors 202, and the transistors 203 are not limited to those illustrated in FIG. 5A, and may be any number more than one. For example, the plurality of flip-flops 201 may be provided corresponding to a plurality of signal lines. Note that the plurality of transistors 203 may include back-gates.

Each of the flip-flops 201_1 to 201_5 includes a logic circuit. As the logic circuit, a logic circuit capable of being used as the logic circuit 101 illustrated in FIGS. 1A, 1B1, and 1B2 can be employed.

A data signal is input to the flip-flops 201_1 to 201_5 through an input terminal of each logic circuit.

Further, a start pulse signal is input to the flip-flop 201_1.

In addition, a clock signal is input to each of the flip-flops 201_1 to 201_5. The input clock signal is, for example, a plurality of clock signals (a clock signal and an inverted clock signal) whose phases are shifted from each other by a half cycle. In that case, terminals to which a clock signal and an inverted clock signal are input are inverted between the adjacent flip-flops 201. The configuration of the flip-flops is not limited to this, and the flip-flops 201_1 to 201_5 may be controlled with use of three or more clock signals. Further, the flip-flops 201_1 to 201_5 output pulse signals OUT_1 to OUT5, respectively. A pulse signal OUT_M−1 output from a flip-flop 201_M−1 is input to a flip-flop 201_M (M is a natural number more than one). When a pulse of the start pulse signal is input to the flip-flop 201_1, a pulse signal OUT_1 is output from the flip-flop 201_1. When a pulse of the pulse signal OUT_M−1 is input to the flip-flop 201_M, a pulse of the pulse signal OUT_M is output from the flip-flop 201_M.

A high power source potential VDD or a low power source potential VSS is applied to one of a pair of electrodes of each of the capacitors 202_1 to 202_5, and the potential of the input terminal of the logic circuit in the corresponding flip-flop 201 is applied to the other of the pair of electrodes. Thus, data of the data signal is written as stored data to each of the capacitors 202_1 to 202_5.

The transistors 203_1 to 203_5 each control conduction between the input terminal of the logic circuit in the corresponding flip-flop 201 and the other of the pair of electrodes of the capacitor 202, thereby controlling rewriting, storing, and reading of the stored data in the capacitor 202. A control signal is input to a gate of each of the transistors 203_1 to 203_5, so that the transistors 203_1 to 203_5 are controlled to be turned on or off.

As each of the transistors 203_1 to 203_5, for example, a transistor with low off-state current capable of being used as the transistor 103 in FIGS. 1A, 1B1, and 1B2 can be employed.

Note that the plurality of capacitors 202 and transistors 203 only need to be provided corresponding to at least two or more flip-flops among the plurality of flip-flops 201. For example, as illustrated in FIG. 5B, the capacitors 202_1, 202_3, and 202_5, and the transistors 203_1, 203_3, and 203_5 may be provided corresponding to every two flip-flops (flip-flops 201_1, 201_3, and 201_5).

Different potentials may be applied to the electrodes of the plurality of capacitors 202. For example, as illustrated in FIG. 5C, the high power source potential VDD may be applied to the capacitors 202_1 and 202_5 and the low power source potential VSS may be applied to the capacitor 202_3.

Figure 6:
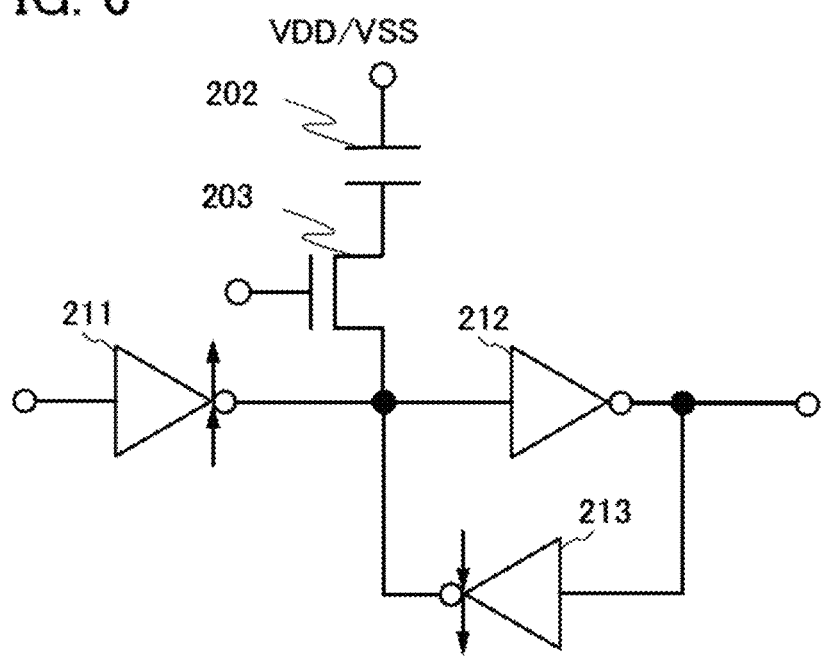
FIG. 6 is a circuit diagram illustrating a configuration of a flip-flop.

An example of the flip-flop is further illustrated in FIG. 6.

The flip-flop illustrated in FIG. 6 includes as a logic circuit a clocked inverter 211, an inverter 212, and a clocked inverter 213.

The clocked inverter 211 includes a data signal input terminal and a data signal output terminal. The pulse signal OUT_M−1 is input from the flip-flop 201_M−1 to the data signal input terminal of the clocked inverter 211 in the flip-flop 201_M. Further, a clock signal and an inverted clocked signal are input to the clocked inverter 211. The clocked inverter 211 has a function of outputting as a data signal a potential corresponding to the input pulse signal OUT, clock signal, and inverted clock signal.

The inverter 212 includes a data signal input terminal and a data signal output terminal. The data signal input terminal of the inverter 212 is electrically connected to the data signal output terminal of the clocked inverter 211, and a potential corresponding to the data signal input through the data signal input terminal is output as an output signal from the inverter 212 through the data signal input terminal.

The clocked inverter 213 includes a data signal input terminal and a data signal output terminal. The data signal input terminal of the clocked inverter 213 is electrically connected to the data signal output terminal of the inverter 212, and the data signal output terminal of the clocked inverter 213 is electrically connected to the data signal output terminal of the clocked inverter 211. Further, a clock signal and an inverted clock signal are input to the clocked inverter 213. The clocked inverter 213 has a function of outputting as a data signal a potential corresponding to the output signal from the inverter 212, and the input clock signal and inverted clock signal.

The clocked inverter 211, the inverter 212, and the clocked inverter 213 are formed using, for example, transistors capable of being used as the transistors 111 and 112 illustrated in FIGS. 1A, 1B1, and 1B2.

Moreover, in FIG. 6, the transistor 203 has a function of controlling conduction between the other of the pair of electrodes of the capacitor 202 and the data signal input terminal of the inverter 212.

Note that the configuration of the flip-flop is not limited to that illustrated in FIG. 6; for example, the flip-flop may be formed using transistors all of which have the same conductivity.

That is the description of an example of the flip-flop.

Next, an example of a method for driving the shift register illustrated in FIG. 5A will be described as an example of a method for driving the shift register of this embodiment.

First, a pulse of a start pulse signal is input to the flip-flop 201_1.

At this time, pulses of the pulse signals OUT_1 to OUT_5 are sequentially output from the flip-flops 201_1 to 201_5.

Description is also made on the case of storing data of a data signal input through the input terminal of the logic circuit provided in each of the flip-flops 201_1 to 201_5.

First, the transistors 203_1 to 203_5 are turned on.

At this time, each of the other electrodes of the capacitors 202_1 to 202_5 has a potential equal to that of the data signal input to the logic circuit in the corresponding flip-flop 201. After that, the corresponding transistor 203 is turned off, whereby data of the data signal is written to the corresponding capacitor 202.

Since the transistor 203 has low off-state current, the data of the written data signal is stored in a period during which the transistor 203 is off. Therefore, the data of the data signal can be stored, for example, even when the supply of a power source voltage to the shift register is stopped.

In the case where the state of the shift register is restored later, the supply of a power source voltage to the shift register is restarted, and then, the transistors 203_1 to 203_5 are turned on.

At this time, each input terminal of the logic circuits in the flip-flops 201_1 to 201_5 has a potential equal to that of the other of the pair of electrodes of the corresponding capacitor 202. Accordingly, the data of the data signal which has been written to the capacitors 202_1 to 202_5 is read to be input to the flip-flops 201_1 to 201_5. Thus, the state of the shift register can be restored.

For example, at the time when a pulse of a pulse signal OUT_3 is output from the flip-flop 201_3, data of a data signal is written to the capacitors 202_1 to 202_5 and the supply of a power source voltage to the shift register is stopped. After that, the supply of a power source voltage is restarted and the data of the data signal which has been written to the capacitors 202_1 to 202_5 is input to the flip-flops 201_1 to 201_5; then, the shift register can be restarted in the state where the pulse of the pulse signal OUT_3 is output from the flip-flop 201_3. As a result, a pulse of a start pulse signal does not need to be input again when the supply of a power source voltage is restarted, allowing quick restoration of the state.

Further, in the shift register of this embodiment, the transistors 203_1 to 203_5 only need to be turned on when data of a data signal is written to and read from the capacitors 202_1 to 202_5. Power consumption can be reduced with a decrease in the number of times the transistors 203_1 to 203_5 are turned on.

As described with reference to FIGS. 5A to 5C and FIG. 6, in the shift register of this embodiment, data of a data signal input to a logic circuit in a flip-flop is retained as stored data in a capacitor with use of a transistor. At this time, the transistor controls conduction between an input terminal of the logic circuit in the flip-flop and one of a pair of electrodes of the capacitor, thereby controlling rewriting, storing, and reading of the stored data.

According to the above structure, data which has been written to the capacitor can be stored, for example, even when the supply of a power source voltage to the shift register is stopped. Further, after the supply of a power source voltage to the shift register is restarted, the data which has been written to the capacitor is read to be input to the flip-flop; thus, the state of the flip-flop can be quickly restored before the supply of a power source voltage is stopped, which allows easy stopping and restarting of supply of a power source voltage.

Embodiment 3

Described in this embodiment is an example of a structure of a transistor used in one embodiment of the present invention.

The transistor of this embodiment can be used as, for example, the transistor 103 in the semiconductor device shown in Embodiment 1, or the transistors 203_1 to 203_5 in the shift register shown in Embodiment 2.

First, an example of a structure of the transistor will be described with reference to a schematic cross-sectional view of FIG. 7. Note that components illustrated in FIG. 7 are not necessarily to scale.

Figure 7:
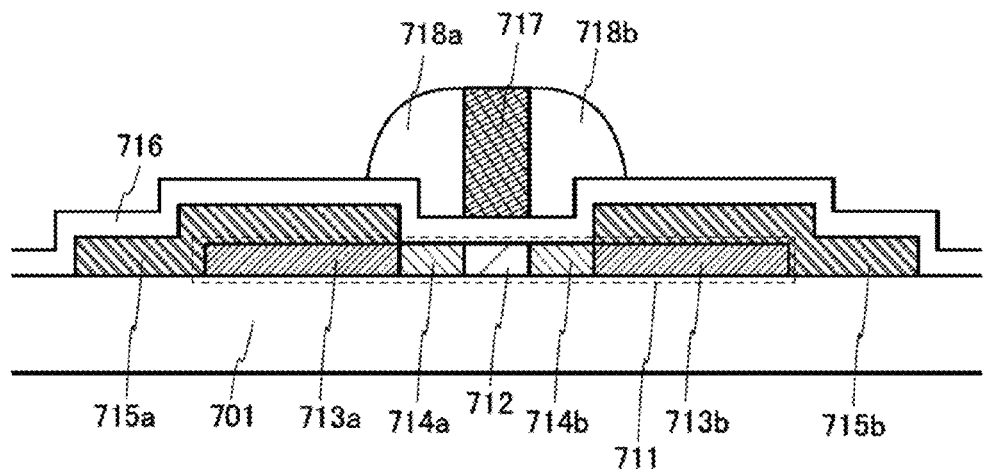
FIG. 7 is a schematic cross-sectional view illustrating an example of a structure of a transistor.

The transistor illustrated in FIG. 7 is a top-gate transistor. The transistor in FIG. 7 includes a semiconductor layer 711, conductive layers 715a and 715b, an insulating layer 716, a conductive layer 717, and insulating layers 718a and 718b. Note that the structure of the transistor is not limited to this, and a bottom-gate transistor may be used.

The semiconductor layer 711 is provided over an element formation layer 701. Note that a base insulating layer may be formed over the element formation layer 701 so that the semiconductor layer 711 is provided over the base insulating layer. Alternatively, the semiconductor layer 711 may be provided over the element formation layer 701 which includes a transistor using a semiconductor containing silicon for a channel formation region.

In the semiconductor layer 711, a region 713a and a region 713b to which a dopant is added are provided separately from each other. Moreover, in the semiconductor layer 711, a region 714a and a region 714b to which a dopant is added are provided separately from each other between the region 713a and the region 713b. The semiconductor layer 711 also includes a channel formation region 712 between the region 714a and the region 714b.

The conductive layers 715a and 715b are in contact with the regions 713a and 713b, respectively.

The insulating layer 716 is provided over the semiconductor layer 711 and the conductive layers 715a and 715b.

The conductive layer 717 overlaps with the semiconductor layer 711 with the insulating layer 716 interposed therebetween.

The insulating layer 718a is provided in contact with one of a pair of side surfaces of the conductive layer 717, and the insulating layer 718b is provided in contact with the other side surface. Further, the insulating layer 718a overlaps with the region 714a with the insulating layer 716 interposed therebetween, and overlaps with a part of the conductive layer 715a with the insulating layer 716 interposed therebetween. Moreover, the insulating layer 718b overlaps with the region 714b with the insulating layer 716 interposed therebetween, and overlaps with a part of the conductive layer 715b with the insulating layer 716 interposed therebetween. In addition, the insulating layer 718a is provided to bridge a gap between the conductive layer 715a and the conductive layer 717, and the insulating layer 718b is provided to bridge a gap between the conductive layer 715b and the conductive layer 717.

The components will be further described below. Each of the components is not limited to a single layer and may be a stack of layers.

The semiconductor layer 711 functions as a layer in which a channel of the transistor is formed (also referred to as a channel formation layer).

For example, an oxide semiconductor layer using an oxide semiconductor can be used as the semiconductor layer 711.

Examples of the oxide semiconductor capable of being used for the oxide semiconductor layer are a metal oxide containing zinc and at least one of indium and gallium, and the metal oxide in which gallium is partly or entirely replaced with another metal element.

As the metal oxide, an In-based metal oxide, a Zn-based metal oxide, an In—Zn-based metal oxide, or an In—Ga—Zn-based metal oxide can be used, for example. Alternatively, the In—Ga—Zn-based metal oxide in which Ga (gallium) is partly or entirely replaced with another metal element may be used.

As the aforementioned another metal element, for example, a metal element that is capable of combining with more oxygen atoms than gallium can be used, and one or more elements of titanium, zirconium, hafnium, germanium, and tin can be used, for instance. Alternatively, as the aforementioned another metal element, one or more elements of lanthanum, cerium, praseodymium, neodymium, samarium, europium, gadolinium, terbium, dysprosium, holmium, erbium, thulium, ytterbium, and lutetium may be used. These metal elements function as a stabilizer. Note that the amount of such a metal element added is determined so that the metal oxide can function as a semiconductor. When a metal element that is capable of combining with more oxygen atoms than gallium is used and oxygen is supplied to a metal oxide, oxygen defects in the metal oxide can be reduced.

For example, when tin is used instead of all of Ga (gallium) contained in the In—Ga—Zn-based metal oxide, an In—Sn—Zn-based metal oxide is obtained. When titanium replaces part of Ga (gallium) contained in the In—Ga—Zn-based metal oxide, an In—Ti—Ga—Zn-based metal oxide is obtained.

The oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, the oxide semiconductor film may include a CAAC-OS. In the CAAC-OS, for example, c-axes are aligned, and a-axes and/or b-axes are not macroscopically aligned.

For example, the oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, the oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that the oxide semiconductor film may be in a single-crystal state, for example.

The oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Crystal part included in the CAAC-OS film fits inside a cube whose one side is less than 100 nm. In an image obtained with a transmission electron microscope (TEM), a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added falls in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electrical characteristics due to irradiation with visible light or ultraviolet light is small. Thus, the transistor has high reliability.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is lower than or equal to −80° C., preferably lower than or equal to −100° C. is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

In the case where an oxide semiconductor layer is used as the semiconductor layer 711, the oxide semiconductor layer can be highly purified in the following manner, for example: dehydration or dehydrogenation is performed so that impurities such as hydrogen, water, a hydroxyl group, and a hydride (also referred to as hydrogen compound) are removed from the oxide semiconductor layer, and oxygen is supplied to the oxide semiconductor layer. For example, a layer containing oxygen is used as the layer in contact with the oxide semiconductor layer and heat treatment is performed; thus, the oxide semiconductor layer can be highly purified.

The oxide semiconductor layer is preferably in a supersaturated state in which the oxygen content is in excess of that in the stoichiometric composition just after its formation. For example, in the case where the oxide semiconductor layer is formed by a sputtering method, the deposition is preferably performed under a condition that the proportion of oxygen in a deposition gas is large, in particular, under an oxygen atmosphere (e.g., oxygen gas: 100%).

The oxide semiconductor film may be formed by a sputtering method at a substrate temperature higher than or equal to 100° C. and lower than or equal to 500° C., preferably higher than or equal to 200° C. and lower than or equal to 350° C.

Further, in order to sufficiently supply oxygen to supersaturate the oxide semiconductor layer with oxygen, an insulating layer containing excess oxygen may be provided as the insulating layer in contact with the oxide semiconductor layer (e.g., the insulating layer 716).

The insulating layer containing excess oxygen can be formed, for example, using an insulating film which is formed by a sputtering method so as to contain a large amount of oxygen. In order to make the insulating layer contain much more excess oxygen, oxygen is added by an ion implantation method, an ion doping method, or plasma treatment. Moreover, oxygen may be added to the oxide semiconductor layer.

In a sputtering apparatus, an entrapment vacuum pump is preferably used because the amount of moisture remaining in a deposition chamber is preferably small. Further, a cold trap may be used.

In the manufacturing process of the transistor, heat treatment is preferably performed. The temperature of the heat treatment is preferably higher than or equal to 350° C. and lower than the strain point of the substrate, more preferably higher than or equal to 350° C. and lower than or equal to 450° C. Note that the heat treatment may be performed more than once.

As a heat treatment apparatus used for the heat treatment, a rapid thermal annealing (RTA) apparatus such as a gas rapid thermal annealing (GRTA) apparatus or a lamp rapid thermal annealing (LRTA) apparatus may be used. Alternatively, another heat treatment apparatus such as an electric furnace may be used.

After the heat treatment, a high-purity oxygen gas, a high-purity $N_2O$ gas, or ultra-dry air (having a dew point of $-40°$ C. or lower, preferably $-60°$ C. or lower) is preferably introduced in the furnace where the heat treatment has been performed while the heating temperature is being maintained or being decreased. In that case, it is preferable that water, hydrogen, and the like be not contained in the oxygen gas or the N20 gas. The purity of the oxygen gas or the $N_2O$ gas which is introduced into the heat treatment apparatus is preferably higher than or equal to 6N, more preferably higher than or equal to 7N. That is, the impurity concentration in the oxygen gas or the $N_2O$ gas is preferably lower than or equal to 1 ppm, more preferably lower than or equal to 0.1 ppm. Through this step, oxygen is supplied to the oxide semiconductor layer, and defects due to oxygen vacancies in the oxide semiconductor layer can be reduced. Note that the high-purity oxygen gas, high-purity $N_2O$ gas, or ultra-dry air may be introduced at the time of the above heat treatment.

The hydrogen concentration in the highly purified oxide semiconductor layer which is measured by secondary ion mass spectrometry (also referred to as SIMS) is preferably lower than or equal to $5\times10^{19}$ atoms/cm$^3$, more preferably lower than or equal to $5\times10^{18}$ atoms/cm$^3$, and still more preferably lower than or equal to $5\times10^{17}$ atoms/cm$^3$.

With the use of the highly purified oxide semiconductor layer, the carrier density of the oxide semiconductor layer in a field-effect transistor can be lower than $1\times10^{14}$ atoms/cm$^3$, preferably lower than $1\times10^{12}$ atoms/cm$^3$, and further preferably lower than $1\times10^{11}$ atoms/cm$^3$. Such a low carrier density can reduce the off-state current of the field-effect transistor per micrometer of channel width to less than or equal to $1\times10^{-19}$ A (100 zA), preferably less than or equal to $1\times10^{-22}$ A (100 yA), further preferably less than or equal to $1\times10^{-23}$ A (10 yA), and still further preferably less than or equal to $1\times10^{-24}$ A (1 yA). It is preferable that the off-state current of the field-effect transistor be as low as possible; the lower limit of the off-state current of the field-effect transistor is estimated to be approximately $1\times10^{-30}$ A/am.

As the dopants contained in the regions 713a and 713b, it is possible to use an element of Group 13 in the periodic table (e.g., boron), an element of Group 15 in the periodic table (e.g., one or more of nitrogen, phosphorus, and arsenic), and/or a rare gas element (e.g., one or more of helium, argon, and xenon), for example. At least one of these elements can be used as the dopants. The regions 713a and 713b make it possible to reduce the resistance between a source and a channel formation region and between a drain and the channel formation region, which enables easy microfabrication.

As the dopants contained in the regions 714a and 714b, it is possible to use an element of Group 13 in the periodic table (e.g., boron), an element of Group 15 in the periodic table (e.g., one or more of nitrogen, phosphorus, and arsenic), and/or a rare gas element (e.g., one or more of helium, argon, and xenon), for example. At least one of these elements can be used as the dopants. Further, the dopants contained in the regions 714a and 714b have a lower concentration than those contained in the regions 713a and 713b. The regions 714a and 714b make it possible to suppress electric-field concentration.

Each of the conductive layers 715a and 715b functions as a source or a drain of the transistor. Each of the conductive layers 715a and 715b can be, for example, a layer containing a metal material such as molybdenum, titanium, chromium, tantalum, magnesium, silver, tungsten, aluminum, copper, neodymium, scandium, or ruthenium.

The insulating layer 716 functions as a gate insulating layer of the transistor. The insulating layer 716 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide.

The conductive layer 717 functions as a gate of the transistor. The conductive layer 717 can be, for example, a layer containing a metal material such as molybdenum, titanium, chromium, tantalum, magnesium, silver, tungsten, aluminum, copper, neodymium, or scandium.

Each of the insulating layers 718a and 718b can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide.

That is the description of an example of the structure of the transistor illustrated in FIG. 7.

As described with reference to FIG. 7, the transistor of this embodiment has low off-state current. Therefore, when the transistor is used as, for example, a transistor for controlling writing, storing, and reading of data to/in/from a capacitor in the semiconductor device of Embodiment 1 or the shift register of Embodiment 2, the data can be stored in the capacitor even when the supply of a power source voltage is stopped.

Embodiment 4

Described in this embodiment are an example of a semiconductor device including a plurality of the semiconductor devices illustrated in FIG. 4B, and an example of operation in stopping the supply of a power source voltage to the semiconductor device.

Figure 8:
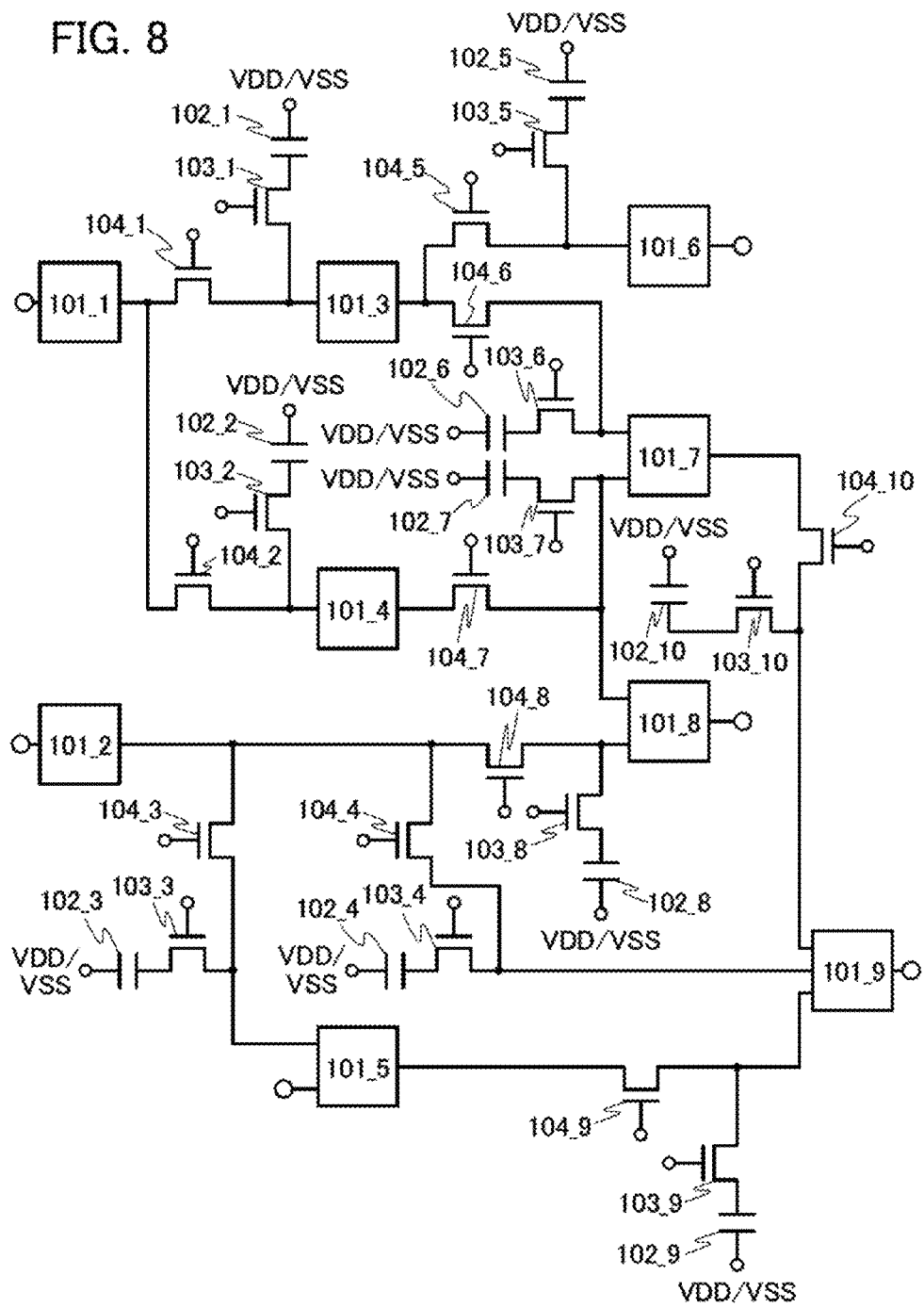
FIG. 8 is a diagram illustrating an example of a semiconductor device.

FIG. 8 is a diagram illustrating a configuration of the semiconductor device of this embodiment. The semiconductor device illustrated in FIG. 8 includes a plurality of logic circuits 101_1 to 101_9; a plurality of capacitors 102_1 to 102_10 each including a pair of electrodes, one of which is supplied with a high power source potential (VDD) or a low power source potential (VSS); transistors 103_1 to 103_10 each controlling conduction between an input terminal of any one of the plurality of logic circuits 101_3 to 101_9 and the other of the pair of electrodes of any one of the plurality of capacitors 102_1 to 102_10; and transistors 104_1 to 104_10 each controlling conduction between an output terminal of any one of the plurality of logic circuits 101_1 to 101_9 and the input terminal of any one of the plurality of logic circuits 101_1 to 101_9.

In other words, the semiconductor device illustrated in FIG. 8 is as follows: a single logic circuit is divided into a plurality of regions, and any one of the capacitors 102_1 to 102_10, any one of the transistors 103_1 to 103_10, and any one of the transistors 104_1 to 104_10 are provided between any two of the regions.

Note that as the transistors 103_1 to 103_10, a transistor capable of being used as the transistor 103 illustrated in FIGS. 1A, 1B1, and 1B2 can be employed. Further, as the transistors 104_1 to 104_10, a transistor capable of being used as the transistor 103 illustrated in FIGS. 1A, 1B1, and 1B2 can be employed.

In the semiconductor device illustrated in FIG. 8, the supply of a power source voltage to the plurality of logic circuits 101_1 to 101_9 can be stopped independently of one another. Accordingly, in the semiconductor device illustrated in FIG. 8, the supply of a power source voltage to some of the plurality of logic circuits 101_1 to 101_9 can be stopped (the supply of a power source voltage can be partly stopped) while the other logic circuits continue to operate (logic operation).

In addition, the plurality of transistors 103_1 to 103_10 and the plurality of transistors 104_1 to 104_10 can be switched (turned on or off) independently of one another. Accordingly, in the semiconductor device illustrated in FIG. 8, even when the supply of a power source voltage is partly stopped, data of a data signal input to any one of the plurality of logic circuits 101_1 to 101_9 can be stored in each of the plurality of capacitors 102_1 to 102_10 as needed.

Figure 9:
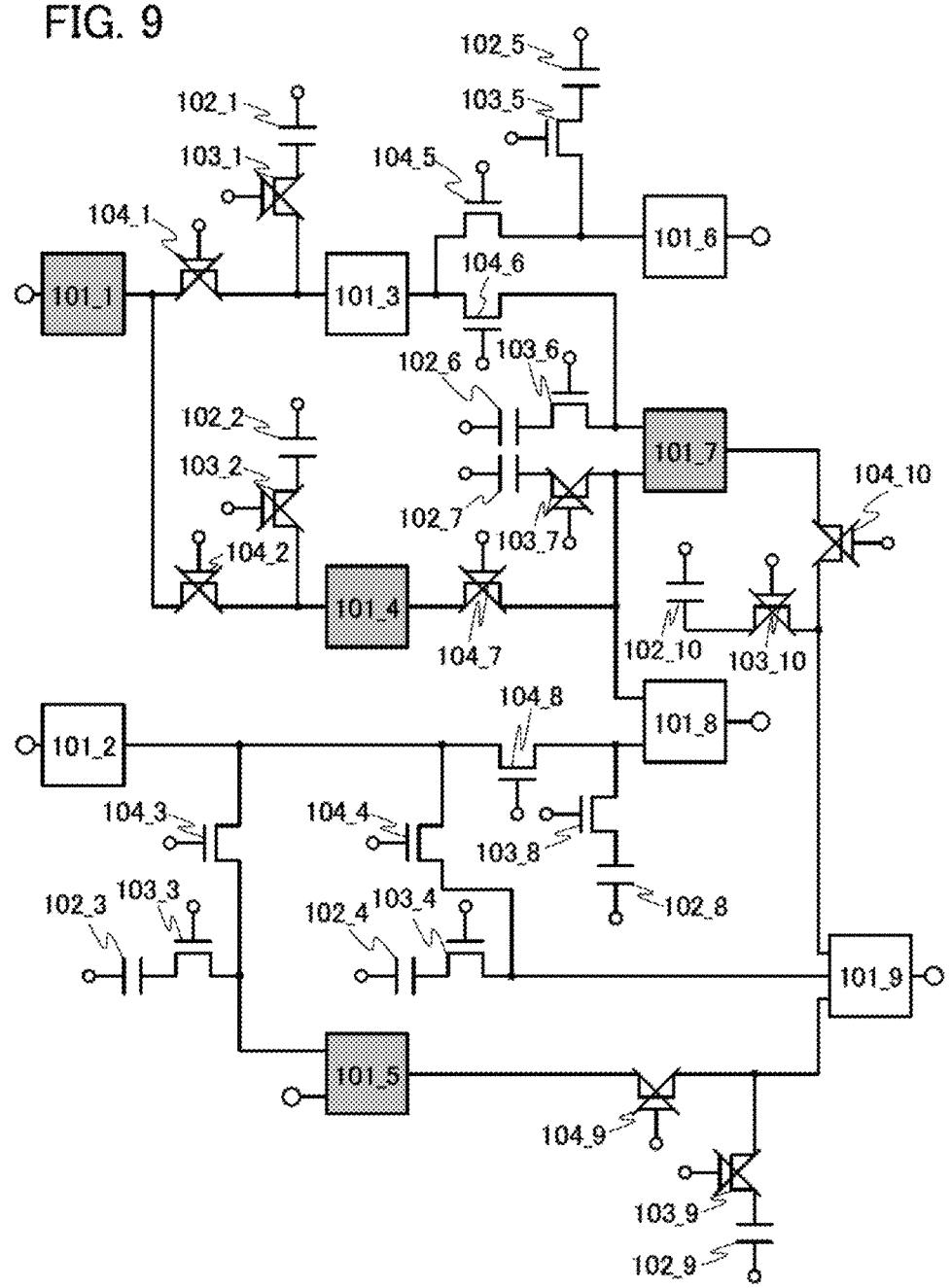
FIG. 9 is a diagram illustrating operation of a semiconductor device.

For example, the supply of a power source voltage may be stopped partly as illustrated in FIG. 9. Note that in FIG. 9, the supply of a power source voltage to the logic circuits 101_1, 101_4, 101_5, and 101_7 is stopped and a power source voltage is supplied to the other logic circuits. In that case, before the supply of a power source voltage is partly stopped, at least the transistors 103_1, 103_2, 103_7, 103_9, and 103_10, and the transistors 104_1, 104_2, 104_7, 104_9, and 104_10 are turned off (denoted as "x" in FIG. 9).

By partly stopping the supply of a power source voltage as illustrated in FIG. 9, power consumption can be reduced and operation can be restarted with little delay after the supply of a power source voltage is restarted.

Note that in the semiconductor device illustrated in FIG. 8, it is possible to stop the supply of a power source voltage to all of the plurality of logic circuits 101_1 to 101_9.

This application is based on Japanese Patent Application serial No. 2012-057282 filed with Japan Patent Office on Mar. 14, 2012, and Japanese Patent Application serial No. 2012-125685 filed with Japan Patent Office on Jun. 1, 2012, the entire contents of which are hereby incorporated by reference.

What is claimed is:

1. A semiconductor device comprising:
a first logic circuit;
a second logic circuit;
a first capacitor and a second capacitor, each comprising a pair of electrodes; and
a first transistor and a second transistor, each comprising an oxide semiconductor layer,
wherein each of the first logic circuit and the second logic circuit comprises an inverter or a clocked inverter,
wherein one of source and drain of the first transistor is electrically connected to one of the pair of electrodes of the first capacitor,
wherein one of source and drain of the second transistor is electrically connected to one of the pair of electrodes of the second capacitor,
wherein the other of source and drain of the first transistor is electrically connected to an output terminal of the first logic circuit,
wherein the other of source and drain of the first transistor is directly connected to an input terminal of the second logic circuit,
wherein the other of source and drain of the second transistor is electrically connected to an output terminal of the second logic circuit, and
wherein a potential of the other of the pair of electrodes of the first capacitor is different from a potential of the other of the pair of electrodes of the second capacitor.

2. The semiconductor device according to claim 1,
wherein each of the first logic circuit and the second logic circuit comprises a third transistor and a fourth transistor,
wherein one of source and drain of the third transistor is electrically connected to a first wiring,
wherein one of source and drain of the fourth transistor is electrically connected to a second wiring, and
wherein the other of source and drain of the third transistor and the other of source and drain of the fourth transistor are electrically connected to each other.

3. The semiconductor device according to claim 1, wherein the first capacitor has a capacitance more than or equal to 1 time and less than 20 times as large as a capacitance of a parasitic capacitor generated in the input terminal of the second logic circuit.

4. The semiconductor device according to claim 1,
wherein a channel formation region of each of the first transistor and the second transistor is formed in the oxide semiconductor layer, and
wherein the oxide semiconductor layer includes a crystal part where a c-axis is aligned in a direction parallel to a normal vector of a surface where the oxide semiconductor layer is formed or a normal vector of a surface of the oxide semiconductor layer, atoms are arranged in a triangular or hexagonal configuration when seen from a direction perpendicular to an a-b plane, and metal atoms are arranged in a layered manner or metal atoms and oxygen atoms are arranged in a layered manner when seen from a direction perpendicular to a c-axis.

5. The semiconductor device according to claim 1, wherein each of the first transistor and the second transistor comprises a gate electrode and a back gate electrode.

6. The semiconductor device according to claim 1,
wherein the potential of the other of the pair of electrodes of the first capacitor is one of a high power source potential or a low power source potential, and
wherein the potential of the other of the pair of electrodes of the second capacitor is the other of the high power source potential and the low power source potential.

7. A semiconductor device comprising:
a first logic circuit;
a second logic circuit;
a first capacitor and a second capacitor, each comprising a pair of electrodes; and
a first transistor and a second transistor, each comprising an oxide semiconductor layer,
wherein each of the first logic circuit and the second logic circuit comprises an inverter or a clocked inverter,
wherein one of source and drain of the first transistor is electrically connected to one of the pair of electrodes of the first capacitor,
wherein one of source and drain of the second transistor is electrically connected to one of the pair of electrodes of the second capacitor, wherein the other of source and drain of the first transistor is electrically connected to an output terminal of the first logic circuit, wherein the other of source and drain of the first transistor is directly connected to an input terminal of the second logic circuit, wherein the other of source and drain of the second transistor is electrically connected to an output terminal of the second logic circuit, wherein a potential of the other of the pair of electrodes of the first capacitor is different from a potential of the other of the pair of electrodes of the second capacitor, and wherein an off-state current per micrometer of channel width of each of the first transistor and the second transistor is lower than or equal to 100 zA.

8. The semiconductor device according to claim 7, wherein the first capacitor has a capacitance more than or equal to 1 time and less than 20 times as large as a capacitance of a parasitic capacitor generated in the input terminal of the second logic circuit.

9. The semiconductor device according to claim 7, wherein a channel formation region of each of the first transistor and the second transistor is formed in the oxide semiconductor layer, and wherein the oxide semiconductor layer includes a crystal part where a c-axis is aligned in a direction parallel to a normal vector of a surface where the oxide semiconductor layer is formed or a normal vector of a surface of the oxide semiconductor layer, atoms are arranged in a triangular or hexagonal configuration when seen from a direction perpendicular to an a-b plane, and metal atoms are arranged in a layered manner or metal atoms and oxygen atoms are arranged in a layered manner when seen from a direction perpendicular to a c-axis.

10. The semiconductor device according to claim 7, wherein each of the first logic circuit and the second logic circuit comprises a third transistor and a fourth transistor, wherein one of source and drain of the third transistor is electrically connected to a first wiring, wherein one of source and drain of the fourth transistor is electrically connected to a second wiring, and wherein the other of source and drain of the third transistor and the other of source and drain of the fourth transistor are electrically connected to each other.

11. The semiconductor device according to claim 7, wherein each of the first transistor and the second transistor comprises a gate electrode and a back gate electrode.

12. The semiconductor device according to claim 7, wherein the potential of the other of the pair of electrodes of the first capacitor is one of a high power source potential or a low power source potential, and wherein the potential of the other of the pair of electrodes of the second capacitor is the other of the high power source potential and the low power source potential.

13. A shift register comprising:

a first flip-flop comprising a first logic circuit;

a second flip-flop comprising a second logic circuit;

a first capacitor and a second capacitor, each comprising a pair of electrodes; and a first transistor and a second transistor, each comprising an oxide semiconductor layer, wherein each of the first logic circuit and the second logic circuit comprises an inverter or a clocked inverter, wherein one of source and drain of the first transistor is electrically connected to one of the pair of electrodes of the first capacitor, wherein one of source and drain of the second transistor is electrically connected to one of the pair of electrodes of the second capacitor, wherein the other of source and drain of the first transistor is electrically connected to an output terminal of the first logic circuit, wherein the other of source and drain of the first transistor is directly connected to an input terminal of the second logic circuit, wherein the other of source and drain of the second transistor is directly electrically connected to an output terminal of the second logic circuit, and wherein a potential of the other of the pair of electrodes of the first capacitor is different from a potential of the other of the pair of electrodes of the second capacitor.

14. The shift register according to claim 13, wherein a channel formation region of each of the first transistor and the second transistor is formed in the oxide semiconductor layer, and wherein the oxide semiconductor layer includes a crystal part where a c-axis is aligned in a direction parallel to a normal vector of a surface where the oxide semiconductor layer is formed or a normal vector of a surface of the oxide semiconductor layer, atoms are arranged in a triangular or hexagonal configuration when seen from a direction perpendicular to an a-b plane, and metal atoms are arranged in a layered manner or metal atoms and oxygen atoms are arranged in a layered manner when seen from a direction perpendicular to a c-axis.

15. The shift register according to claim 13, wherein each of the first logic circuit and the second logic circuit comprises a third transistor and a fourth transistor, wherein one of source and drain of the third transistor is electrically connected to a first wiring, wherein one of source and drain of the fourth transistor is electrically connected to a second wiring, and wherein the other of source and drain of the third transistor and the other of source and drain of the fourth transistor are electrically connected to each other.

16. The shift register according to claim 13, wherein the first capacitor has a capacitance more than or equal to 1 time and less than 20 times as large as a capacitance of a parasitic capacitor generated in the input terminal of the second logic circuit.

17. The shift register according to claim 13, wherein each of the first transistor and the second transistor comprises a gate electrode and a back gate electrode.

18. The shift register according to claim 13, wherein the potential of the other of the pair of electrodes of the first capacitor is one of a high power source potential or a low power source potential, and wherein the potential of the other of the pair of electrodes of the second capacitor is the other of the high power source potential and the low power source potential.

* * * * *

UNITED STATES PATENT AND TRADEMARK OFFICE
CERTIFICATE OF CORRECTION

PATENT NO.         : 9,058,892 B2
APPLICATION NO.    : 13/785237
DATED              : June 16, 2015
INVENTOR(S)        : Yamazaki It is certified that error appears in the above-identified patent and that said Letters Patent is hereby corrected as shown below:

In the specification

Column 5, line 20, replace "12" with --1/2--;

Column 8, line 49, replace "OUTS" with --OUT_5--;

Column 15, line 64, replace "$10^{-3o}$" with --$10^{-30}$--; and

In the claims

Column 20, line 17, claim 13 after "is" delete "directly".

Signed and Sealed this
Ninth Day of February, 2016

Michelle K. Lee
*Director of the United States Patent and Trademark Office*